(12) United States Patent
Tseng et al.

(10) Patent No.: US 11,540,396 B2
(45) Date of Patent: Dec. 27, 2022

(54) CIRCUIT BOARD STRUCTURE AND MANUFACTURING METHOD THEREOF

(71) Applicant: Unimicron Technology Corp., Taoyuan (TW)

(72) Inventors: Tzyy-Jang Tseng, Taoyuan (TW); Shao-Chien Lee, Taipei (TW); John Hon-Shing Lau, Taoyuan (TW); Chen-Hua Cheng, Taoyuan (TW); Ra-Min Tain, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/191,559

(22) Filed: Mar. 3, 2021

(65) Prior Publication Data

US 2022/0071015 A1    Mar. 3, 2022

Related U.S. Application Data (60) Provisional application No. 63/071,369, filed on Aug. 28, 2020.

(30) Foreign Application Priority Data

Jan. 12, 2021  (TW) ................................. 110101060

(51) Int. Cl.
  *H05K 1/00*     (2006.01)
  *H05K 1/02*     (2006.01)
  (Continued)

(52) U.S. Cl.
  CPC ......... *H05K 3/0097* (2013.01); *H05K 3/4069* (2013.01); *H05K 3/4632* (2013.01); *H05K 1/0393* (2013.01)

(58) Field of Classification Search
  CPC ... H05K 1/00; H05K 1/02; H05K 1/11; H05K 1/12; H05K 1/16; H05K 1/112;
  (Continued)

(56) References Cited

U.S. PATENT DOCUMENTS 5,157,589 A * 10/1992 Cole, Jr. .............. H05K 3/4635
                                                       361/795
6,768,064 B2   7/2004 Higuchi et al.
          (Continued)

FOREIGN PATENT DOCUMENTS

TW          I698972         7/2020

OTHER PUBLICATIONS

"Office Action of Taiwan Related Application, application No. 110117243", dated Nov. 16, 2021, p. 1-p. 4.

*Primary Examiner* — Xiaoliang Chen
(74) *Attorney, Agent, or Firm* — JCIPRNET (57) ABSTRACT

A circuit board structure includes a first sub-circuit board, a second sub-circuit board, and a third sub-circuit board. The first sub-circuit board has an upper surface and a lower surface opposite to each other, and includes at least one first conductive through hole. The second sub-circuit board is disposed on the upper surface of the first sub-circuit board and includes at least one second conductive through hole. The third sub-circuit board is disposed on the lower surface of the first sub-circuit board and includes at least one third conductive through hole. At least two of the first conductive through hole, the second conductive through hole, and the third conductive through hole are alternately arranged in an axial direction perpendicular to an extending direction of the first sub-circuit board. The first sub-circuit board, the second sub-circuit board, and the third sub-circuit board are electrically connected to one another.

5 Claims, 8 Drawing Sheets

(51) Int. Cl.
  *H05K 1/11* (2006.01)
  *H05K 1/16* (2006.01)
  *H05K 3/00* (2006.01)
  *H05K 3/28* (2006.01)
  *H05K 3/38* (2006.01)
  *H05K 3/46* (2006.01)
  *H01L 23/12* (2006.01)
  *H01L 23/13* (2006.01)
  *H01L 23/48* (2006.01)
  *H01L 23/52* (2006.01)
  *H01L 23/552* (2006.01)
  *H05K 3/40* (2006.01)
  *H05K 1/03* (2006.01)

(58) Field of Classification Search
  CPC ........ H05K 1/115; H05K 1/162; H05K 1/183; H05K 1/186; H05K 3/00; H05K 3/28; H05K 3/38; H05K 3/46; H05K 3/282; H05K 3/4038; H05K 3/4044; H05K 3/4046; H05K 3/4658; H05K 3/4694; H01L 21/486; H01L 21/4857; H01L 23/12; H01L 23/13; H01L 23/48; H01L 23/52; H01L 23/552
  USPC ........ 174/250, 257, 260, 262, 264; 361/720, 361/795; 257/659, 734, 758; 428/98.2, 428/137
  See application file for complete search history.

(56) References Cited

U.S. PATENT DOCUMENTS

| | | | |
|---|---|---|---|
| 2002/0159243 A1* | 10/2002 | Ogawa | H01L 23/49822 361/780 |
| 2007/0262452 A1* | 11/2007 | Oi | H01L 24/82 257/758 |
| 2008/0107863 A1* | 5/2008 | Ikeda | H01L 23/49827 428/137 |
| 2008/0155820 A1* | 7/2008 | Arai | H01L 23/49833 29/830 |
| 2011/0209904 A1* | 9/2011 | Ishida | H05K 3/4038 174/257 |
| 2011/0240356 A1* | 10/2011 | Wakita | H05K 3/4644 29/829 |
| 2012/0055706 A1* | 3/2012 | Mok | H05K 1/162 29/25.41 |
| 2012/0161311 A1* | 6/2012 | Miyasaka | H01L 23/49894 257/734 |
| 2012/0319254 A1* | 12/2012 | Kikuchi | H05K 1/186 257/659 |
| 2014/0146500 A1 | 5/2014 | Shimizu et al. | |
| 2015/0223341 A1* | 8/2015 | Kim | H05K 3/007 29/831 |
| 2015/0348918 A1* | 12/2015 | Park | H01L 23/49822 257/532 |
| 2016/0037645 A1* | 2/2016 | Lee | H05K 3/4697 29/846 |
| 2016/0105960 A1* | 4/2016 | Sakamoto | H01L 23/5383 174/262 |
| 2016/0154924 A1* | 6/2016 | Ozawa | G06F 30/398 716/115 |
| 2016/0183372 A1* | 6/2016 | Park | H05K 1/0292 174/262 |
| 2016/0190053 A1* | 6/2016 | Machida | H01L 23/49822 361/768 |
| 2016/0205780 A1* | 7/2016 | Lee | H05K 3/4038 174/257 |
| 2016/0282571 A1* | 9/2016 | Fujiwara | G02B 6/428 |
| 2016/0338195 A1* | 11/2016 | Ikeda | H05K 1/0298 |
| 2017/0354044 A1* | 12/2017 | Kurahashi | H05K 3/4038 |
| 2018/0146554 A1* | 5/2018 | Kajihara | H05K 1/115 |
| 2019/0311990 A1* | 10/2019 | Oda | H01L 25/0655 |
| 2020/0105663 A1* | 4/2020 | Tsai | H01L 23/49827 |
| 2020/0335443 A1* | 10/2020 | Sun Zhou | H01L 21/6835 |
| 2022/0065897 A1* | 3/2022 | Tseng | G01R 1/07328 |

\* cited by examiner

CIRCUIT BOARD STRUCTURE AND MANUFACTURING METHOD THEREOF

CROSS-REFERENCE TO RELATED APPLICATION

This application claims the priority benefits of U.S. provisional application Ser. No. 63/071,369, filed on Aug. 28, 2020, and Taiwan application serial no. 110101060, filed on Jan. 12, 2021. The entirety of each of the above-mentioned patent applications is hereby incorporated by reference herein and made a part of this specification.

BACKGROUND OF THE INVENTION

Field of the Invention

The invention relates to a circuit board structure and a manufacturing method thereof, and more particularly to a circuit board structure and a manufacturing method thereof that may reduce costs.

Description of Related Art

In general, two circuit boards having circuits or conductive structures are connected to each other via a solder-free block, and an underfill is used to fill the gap between the two substrates to seal the solder-free block. However, during the process of high-temperature reflow of the solder, the circuit board with a larger area size cannot be released due to stress, and larger warpage is likely to occur, thereby reducing the assembly yield between the two circuit boards.

SUMMARY OF THE INVENTION

The invention provides a circuit board structure without using solder and underfill, thus reducing the cost and having better structural reliability.

The invention provides a manufacturing method of a circuit board structure for manufacturing the above circuit board structure.

A circuit board structure of the invention includes a first sub-circuit board, a second sub-circuit board, and a third sub-circuit board. The first sub-circuit board has an upper surface and a lower surface opposite to each other, and includes at least one first conductive through hole. The second sub-circuit board is disposed on the upper surface of the first sub-circuit board and includes at least one second conductive through hole. The third sub-circuit board is disposed on the lower surface of the first sub-circuit board and includes at least one third conductive through hole. At least two of the first conductive through hole, the second conductive through hole, and the third conductive through hole are alternately arranged in an axial direction perpendicular to an extending direction of the first sub-circuit board. The first sub-circuit board, the second sub-circuit board, and the third sub-circuit board are electrically connected to one another.

In an embodiment of the invention, the first sub-circuit board further includes a substrate having the upper surface and the lower surface, and the first conductive through hole penetrates the substrate.

In an embodiment of the invention, the second sub-circuit board further includes a first substrate, a first circuit layer, and a second circuit layer. The first substrate has a first surface and a second surface opposite to each other. The second conductive through hole penetrates the first substrate. The first circuit layer is disposed on the first surface of the first substrate and exposes a portion of the first surface. The second circuit layer is disposed on the second surface of the first substrate and exposes a portion of the second surface. The first circuit layer and the second circuit layer are electrically connected via the second conductive through hole. The second circuit layer is electrically connected to the first conductive through hole of the first sub-circuit board.

In an embodiment of the invention, the second sub-circuit board further includes a first solder mask and a second solder mask. The first solder mask is disposed on the first surface exposed by the first circuit layer, and extended to cover a portion of the first circuit layer. The second solder mask is disposed on the second surface exposed by the second circuit layer, and extended to cover a portion of the second circuit layer.

In an embodiment of the invention, the third sub-circuit board further includes a second substrate, a third circuit layer, and a fourth circuit layer. The second substrate has a third surface and a fourth surface opposite to each other, and the third conductive through hole penetrates the second substrate. The third circuit layer is disposed on the third surface of the second substrate and exposes a portion of the third surface. The fourth circuit layer is disposed on the fourth surface of the second substrate and exposes a portion of the fourth surface. The third circuit layer and the fourth circuit layer are electrically connected via the third conductive through hole. The third circuit layer is electrically connected to the first conductive through hole of the first sub-circuit board.

In an embodiment of the invention, the third sub-circuit board further includes a first solder mask and a second solder mask. The first solder mask is disposed on the third surface exposed by the third circuit layer, and extended to cover a portion of the third circuit layer. The second solder mask is disposed on the fourth surface exposed by the fourth circuit layer, and extended to cover a portion of the fourth circuit layer.

In an embodiment of the invention, the first sub-circuit board further includes a plurality of circuit layers and a plurality of dielectric layers. The circuit layers and the dielectric layers are alternately arranged. The at least one first conductive through hole includes a plurality of first conductive through holes, and the first conductive through holes penetrate the dielectric layers and are electrically connected to the circuit layers.

In an embodiment of the invention, the second sub-circuit board further includes a first substrate, and the second conductive through hole penetrates the first substrate. The third sub-circuit board further includes a second substrate, and the third conductive through hole penetrates the second substrate. The circuit board structure further includes two patterned circuit layers respectively disposed on the first substrate and the second substrate and electrically connected to the second conductive through hole and the third conductive through hole.

In an embodiment of the invention, the second sub-circuit board is a reconfiguration circuit board having a fine circuit, and the third sub-circuit board is a multilayer circuit board.

A manufacturing method of a circuit board structure of the invention includes the following steps. A first sub-circuit board is provided. The first sub-circuit board has an upper surface and a lower surface opposite to each other, and includes at least one first conductive through hole. A second sub-circuit board is provided on the upper surface of the first sub-circuit board. The second sub-circuit board includes at least one second conductive through hole. A third sub-circuit board is provided on the lower surface of the first sub-circuit board. The third sub-circuit board includes at least one third conductive through hole. The first sub-circuit board, the second sub-circuit board, and the third sub-circuit board are laminated so that at least two of the first conductive through hole, the second conductive through hole, and the third conductive through hole are alternately arranged in an axial direction perpendicular to an extending direction of the first sub-circuit board. The first sub-circuit board, the second sub-circuit board, and the third sub-circuit board are electrically connected to one another.

In an embodiment of the invention, the first sub-circuit board further includes a substrate having an upper surface and a lower surface. The first conductive through hole penetrates the substrate. Before the first sub-circuit board, the second sub-circuit board, and the third sub-circuit board are laminated, the substrate is in a B-stage state. After the first sub-circuit board, the second sub-circuit board, and the third sub-circuit board are laminated, the substrate is transformed from the B-stage state to a C-stage state.

Based on the above, in the circuit board structure and the manufacturing method thereof of the invention, the circuit board structure is formed by laminating the first sub-circuit board, the second sub-circuit board, and the third sub-circuit board. At least two of the first conductive through hole, the second conductive through hole, and the third conductive through hole are alternately arranged in the axial direction perpendicular to the extending direction of the first sub-circuit board, and the first sub-circuit board, the second sub-circuit board, and the third sub-circuit board are electrically connected to one another via the first conductive through hole, the second conductive through hole, and the third conductive through hole. Thereby, the manufacturing method of the circuit board structure of the invention does not need to use solder and underfill, thus effectively reducing the manufacturing cost of the circuit board structure. Moreover, since solder is not used, the bonding yield among the first sub-circuit board, the second sub-circuit board, and the third sub-circuit board may be effectively improved, thereby improving the structural reliability of the circuit board structure of the invention.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
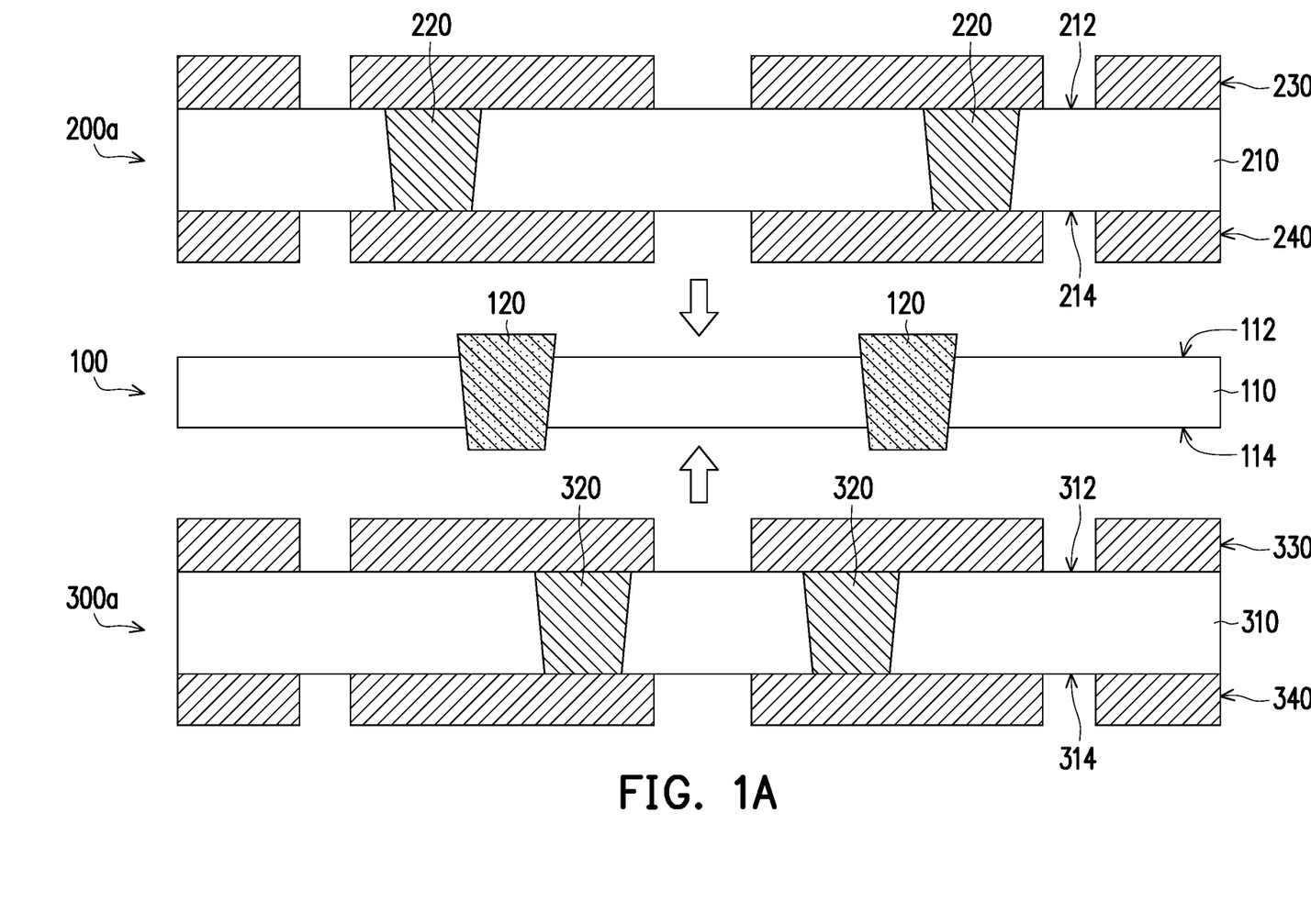
FIG. 1A to FIG. 1B are schematic cross-sectional views of a manufacturing method of a circuit board structure according to an embodiment of the invention.
Figure 1B:
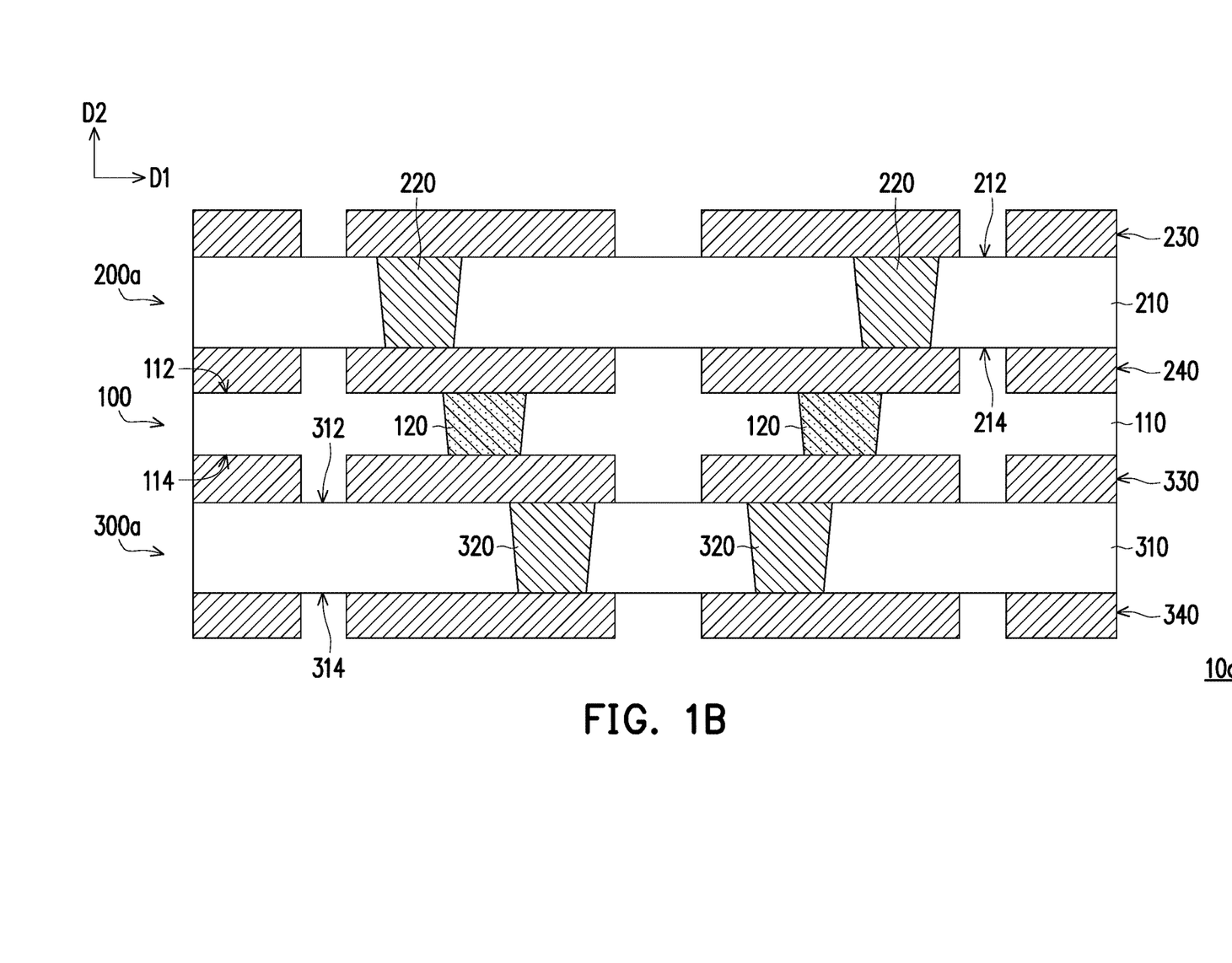

FIG. 1A to FIG. 1B are schematic cross-sectional views of a manufacturing method of a circuit board structure according to an embodiment of the invention. Regarding the manufacturing method of the circuit board structure of the present embodiment, first, referring to FIG. 1A, a first sub-circuit board 100 is provided. In detail, the first sub-circuit board 100 includes a substrate 110 and at least one first conductive through hole (two first conductive through holes 120 are schematically shown). The substrate 110 has an upper surface 112 and a lower surface 114 opposite to each other. The first conductive through holes 120 penetrate the substrate 110 and are protruded beyond the upper surface 112 and the lower surface 114. At this time, the substrate 110 is in a B-stage state, that is, the substrate 110 is in an incompletely cured state. Here, the material of the substrate 110 includes polypropylene (PP), and the material of the first conductive through holes 120 is, for example, a conductive metal adhesive manufactured by transient liquid phase sintering (TLPS) coating and has the effects of electrical and thermal conductivity, and is suitable for joining with any metal material, and is not converted back to liquid by heat.

Next, referring to FIG. 1A again, a second sub-circuit board 200a is provided on the upper surface 112 of the first sub-circuit board 100. Specifically, the second sub-circuit board 200a includes a first substrate 210, at least one second conductive through hole (two second conductive through holes 220 are schematically shown), a first circuit layer 230, and a second circuit layer 240. The first substrate 210 has a first surface 212 and a second surface 214 opposite to each other. The second conductive through holes 220 penetrate the first substrate 210. The first circuit layer 230 is disposed on the first surface 212 of the first substrate 210 and exposes a portion of the first surface 212. The second circuit layer 240 is disposed on the second surface 214 of the first substrate 210 and exposes a portion of the second surface 214. The first circuit layer 230 and the second circuit layer 240 are electrically connected via the second conductive through holes 220. At this time, the second sub-circuit board 200a is in a C-stage state, that is, the second sub-circuit board 200a is in a completely cured state.

Then, a third sub-circuit board 300a is provided on the lower surface 114 of the first sub-circuit board 100. Specifically, the third sub-circuit board 300a includes a second substrate 310, at least one third conductive through hole (two third conductive through holes 320 are schematically shown), a third circuit layer 330, and a fourth circuit layer 340. The second substrate 310 has a third surface 312 and a fourth surface 314 opposite to each other, and the third conductive through holes 320 penetrate the second substrate 310. The third circuit layer 330 is disposed on the third surface 312 of the second substrate 310 and exposes a portion of the third surface 312. The fourth circuit layer 340 is disposed on the fourth surface 314 of the second substrate 310 and exposes a portion of the fourth surface 314. The third circuit layer 330 and the fourth circuit layer 340 are electrically connected via the third conductive through holes 320. At this time, the third sub-circuit board 300a is in a C-stage state, that is, the third sub-circuit board 300a is in a completely cured state.

Next, referring to FIG. 1A and FIG. 1B at the same time, the first sub-circuit board 100, the second sub-circuit board 200a, and the third sub-circuit board 300a are laminated by a hot pressing method so that at least two of the first conductive through holes 120, the second conductive through holes 220, and the third conductive through holes 320 are alternately arranged in an axial direction D2 perpendicular to an extending direction D1 the first sub-circuit board 100. Here, the first conductive through holes 120, the second conductive through holes 220, and the third conductive through holes 320 are alternately arranged in the axial direction D2. That is, the first conductive through holes 120, the second conductive through holes 220, and the third conductive through holes 320 are not on the same axis. During hot pressing, the second circuit layer 240 of the second sub-circuit board 200a is directly in contact with the upper surface 112 of the substrate 110 and squeezes the first conductive through holes 120 so that the first conductive through holes 120 are deformed. The third circuit layer 330 of the third sub-circuit board 300a is directly in contact with the lower surface 114 of the substrate 110 and squeezes the first conductive through holes 120 so that the first conductive through holes 120 are deformed. At this point, since the substrate 110 is not completely cured and has flexibility and adhesiveness, the substrate 110 may be bonded to the second circuit layer 240 and the third circuit layer 330 and squeezed onto the second surface 214 exposed by the second circuit layer 240 and onto the third surface 312 exposed by the third circuit layer 330. After lamination and curing, the substrate 110 of the first sub-circuit board 100 is transformed from the B-stage state to the C-stage state. That is, the first sub-circuit board 100 is in a completely cured state, so that the first sub-circuit board 100, the second sub-circuit board 200a, and the third sub-circuit board 300a are firmly joined together. In other words, the first sub-circuit board 100 may be regarded as a connection structure for joining the second sub-circuit board 200a and the third sub-circuit board 300a.

As shown in FIG. 1B, the second circuit layer 240 of the second sub-circuit board 200a is electrically connected to the first conductive through holes 120 of the first sub-circuit board 100. The third circuit layer 330 of the third sub-circuit board 300a is electrically connected to the first conductive through holes 120 of the first sub-circuit board 100. In other words, the first sub-circuit board 100, the second sub-circuit board 200a, and the third sub-circuit board 300a are electrically connected to one another via the first conductive through holes 120, the second conductive through holes 220, and the third conductive through holes 320. At this point, the manufacture of the circuit board structure 10a is complete.

In short, in the present embodiment, the circuit board structure 10a is formed by laminating the first sub-circuit board 100, the second sub-circuit board 200a, and the third sub-circuit board 300a. The first conductive through holes 120, the second conductive through holes 220, and the third conductive through holes 320 are alternately arranged in the axial direction D2 perpendicular to the extending direction D1 of the first sub-circuit board 100, and the first sub-circuit board 100, the second sub-circuit board 200a, and the third sub-circuit board 300a are electrically connected to one another via the first conductive through holes 120, the second conductive through holes 220, and the third conductive through holes 320. Thereby, the manufacturing method of the circuit board structure 10a of the present embodiment does not need to use solder and underfill, thus effectively reducing the manufacturing cost of the circuit board structure 10a. Moreover, since solder is not used, the bonding yield among the first sub-circuit board 100, the second sub-circuit board 200a, and the third sub-circuit board 300a may be effectively improved, thereby improving the structural reliability of the circuit board structure 10a of the present embodiment.

It should be mentioned here that, the following embodiments adopt the reference numerals of the embodiment above and a portion of the content thereof, wherein the same reference numerals are used to represent the same or similar devices and descriptions of the same technical content are omitted. The omitted portions are as described in the embodiments above and are not repeated in the embodiments below.

Figure 2A:
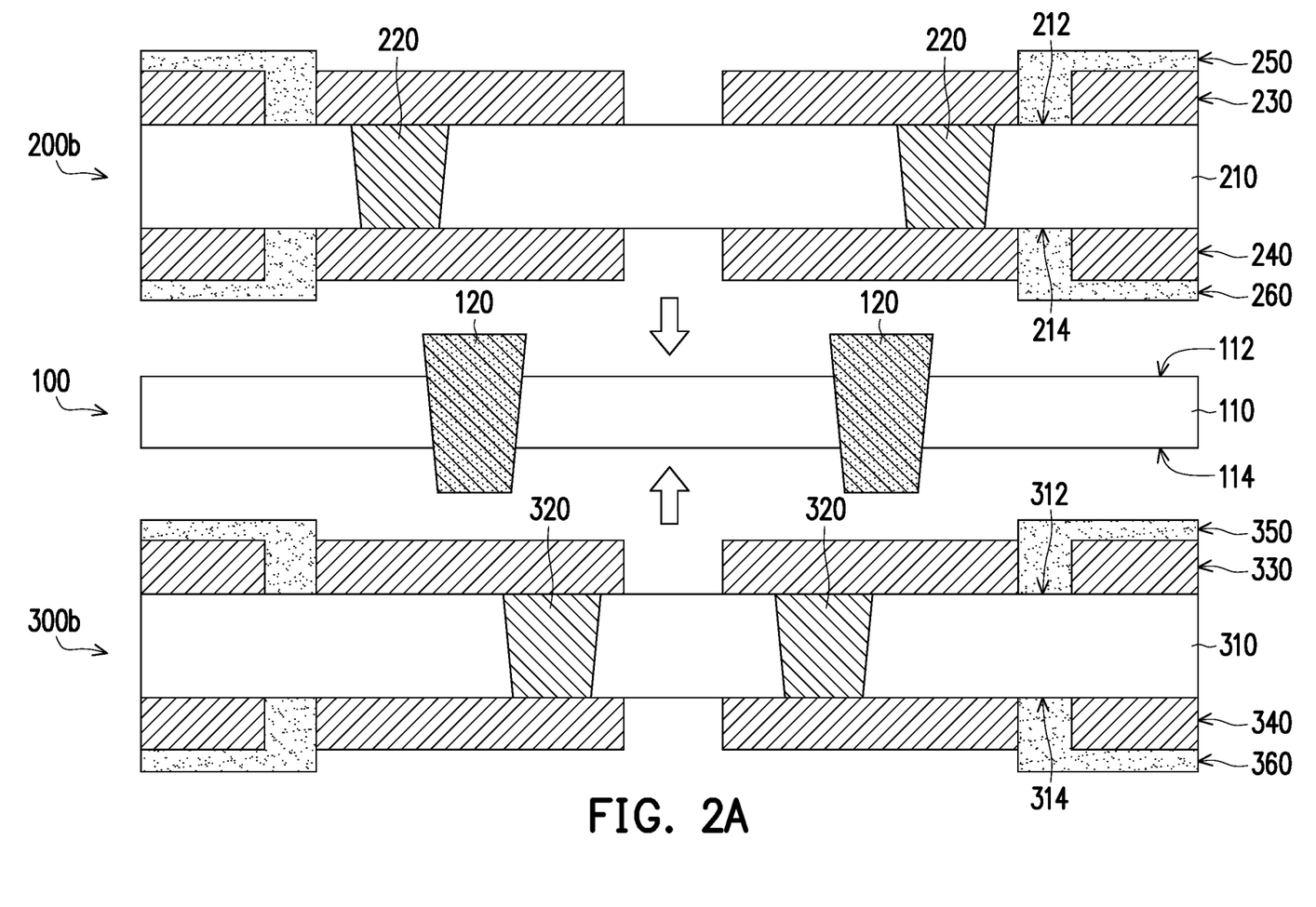
FIG. 2A to FIG. 2B are schematic cross-sectional views of a manufacturing method of a circuit board structure according to another embodiment of the invention.
Figure 2B:
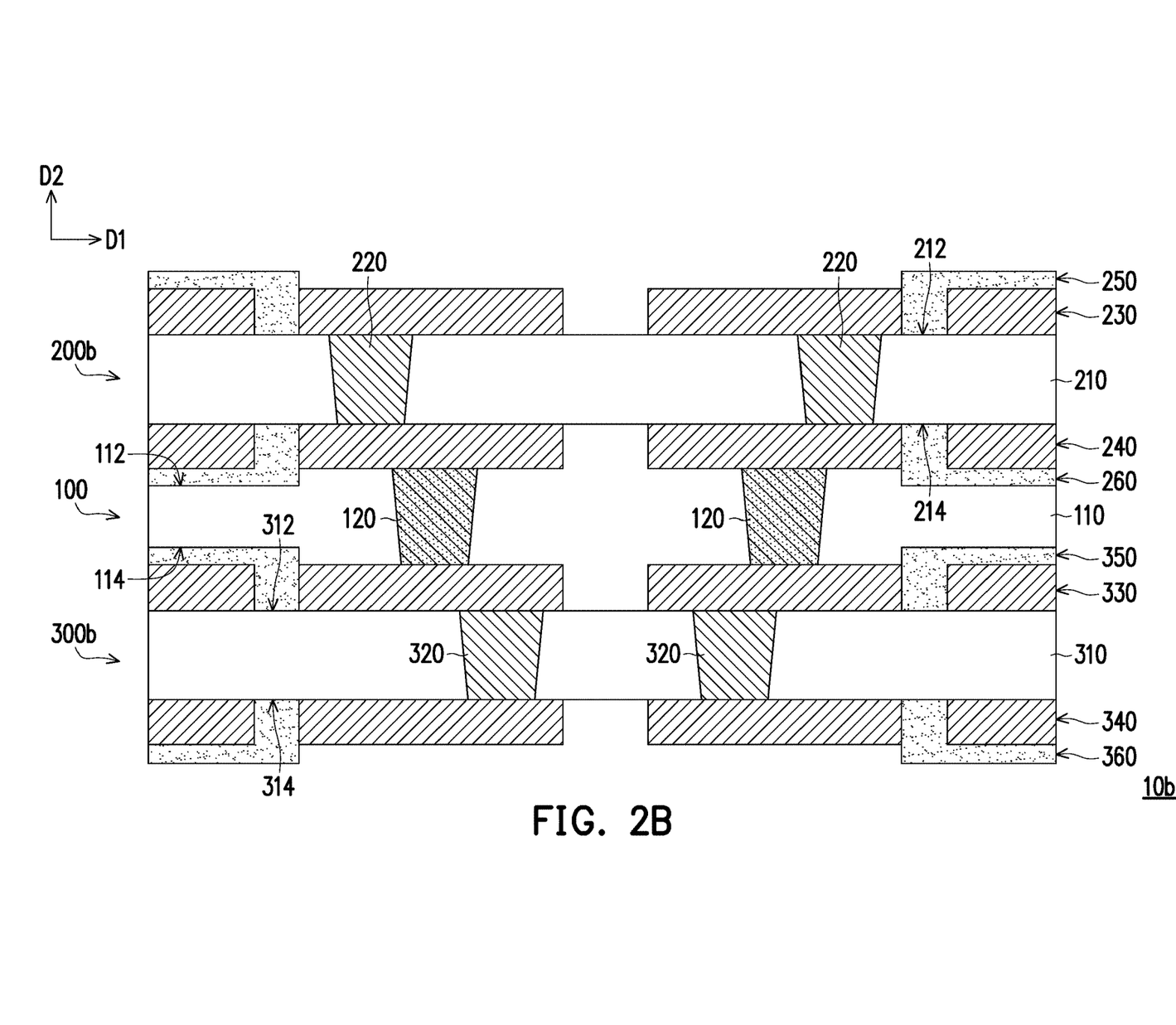

FIG. 2A to FIG. 2B are schematic cross-sectional views of a manufacturing method of a circuit board structure according to another embodiment of the invention. Referring first to FIG. 2A and FIG. 1A at the same time, the manufacturing method of a circuit board structure 10b of the present embodiment is similar to the manufacturing method of the circuit board structure 10a, and the difference between the two is: in the present embodiment, the second sub-circuit board 200b further includes a first solder mask 250 and a second solder mask 260. The first solder mask 250 is disposed on the first surface 212 exposed by the first circuit layer 230, and extended to cover a portion of the first circuit layer 230. The second solder mask 260 is disposed on the second surface 214 exposed by the second circuit layer 240, and extended to cover a portion of the second circuit layer 240. Moreover, the third sub-circuit board 300b further includes a first solder mask 350 and a second solder mask 360. The first solder mask 350 is disposed on the third surface 312 exposed by the third circuit layer 330, and extended to cover a portion of the third circuit layer 330. The second solder mask 360 is disposed on the fourth surface 314 exposed by the fourth circuit layer 340, and extended to cover a portion of the fourth circuit layer 340.

Referring to FIG. 2A and FIG. 2B at the same time, when the first sub-circuit board 100, the second sub-circuit board 200b, and the third sub-circuit board 300b are laminated to form the circuit board structure 10b, since the substrate 110 is not completely cured and has flexibility and adhesiveness, the substrate 110 may be bonded to the second solder mask 260 of the second sub-circuit board 200b and the first solder mask 350 of the third sub-circuit board 300b and squeezed onto the second surface 214 exposed by the second circuit layer 240 and onto the third surface 312 exposed by the third circuit layer 330. At this point, the second circuit layer 240 of the second sub-circuit board 200b is directly in contact with the upper surface 112 of the substrate 110 and squeezes the first conductive through holes 120 so that the first conductive through holes 120 are deformed. The third circuit layer 330 of the third sub-circuit board 300b is directly in contact with the lower surface 114 of the substrate 110 and squeezes the first conductive through holes 120 so that the first conductive through holes 120 are deformed. The first sub-circuit board 100, the second sub-circuit board 200b, and the third sub-circuit board 300b are electrically connected to one another via the first conductive through holes 120, the second conductive through holes 220, and the third conductive through holes 320.

In short, the first sub-circuit board 100 of the present embodiment may be regarded as an interposer, and the state of the substrate 110 is changed by a hot pressing method so that the second solder mask 260 and the second circuit layer 240 of the second sub-circuit board 200b and the first solder mask 350 and the third circuit layer 330 of the third sub-circuit board 300b are directly bonded on the upper surface 112 and the lower surface 114 of the substrate 110. Thereby, no solder and underfill are needed, and the manufacturing cost of the circuit board structure 10b may be effectively reduced. Moreover, since solder is not used, the bonding yield among the first sub-circuit board 100, the second sub-circuit board 200b, and the third sub-circuit board 300b may be effectively improved, thereby improving the structural reliability of the circuit board structure 10b of the present embodiment.

Figure 3A:
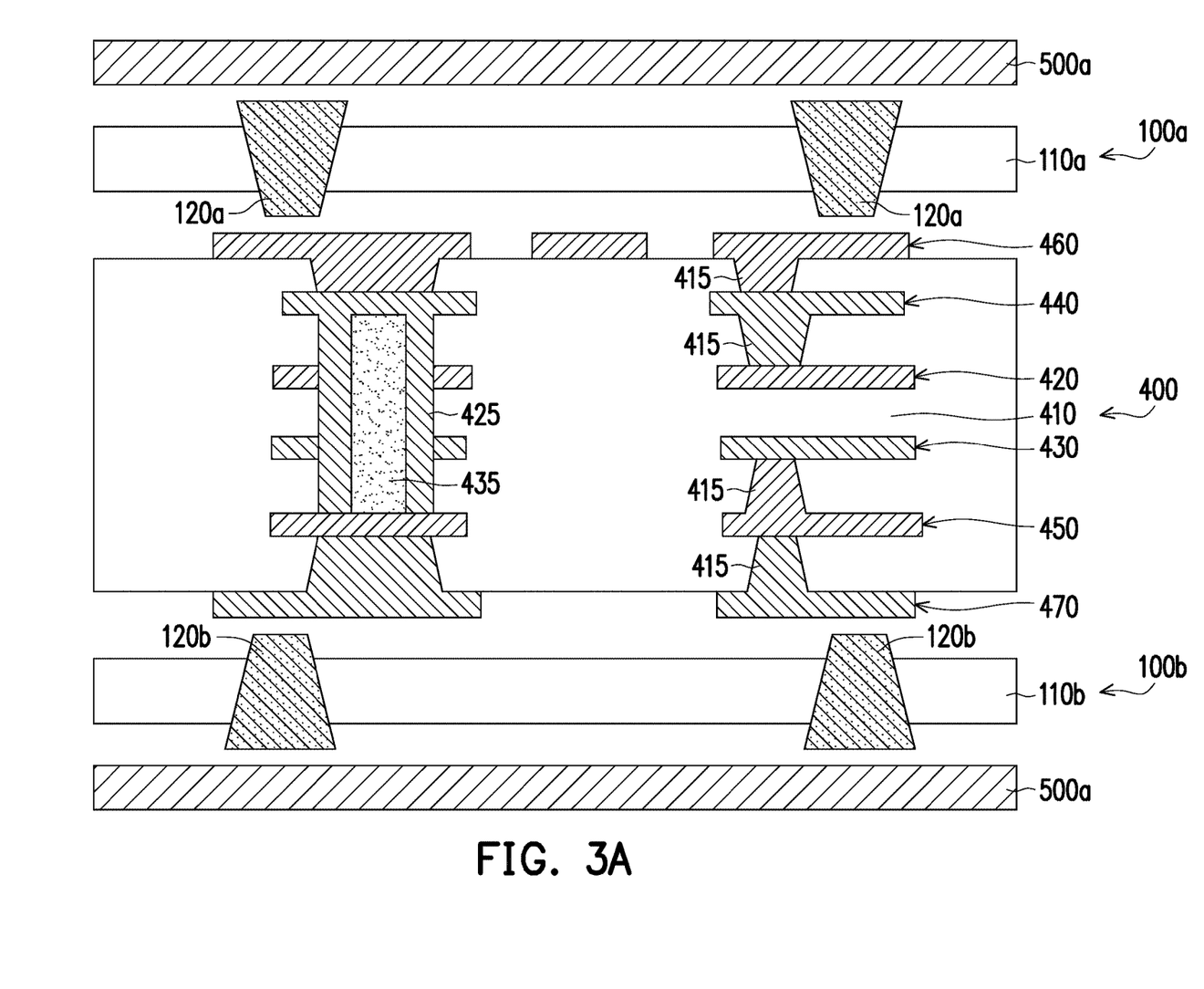
FIG. 3A to FIG. 3C are schematic cross-sectional views of a manufacturing method of a circuit board structure according to another embodiment of the invention.
Figure 3B:
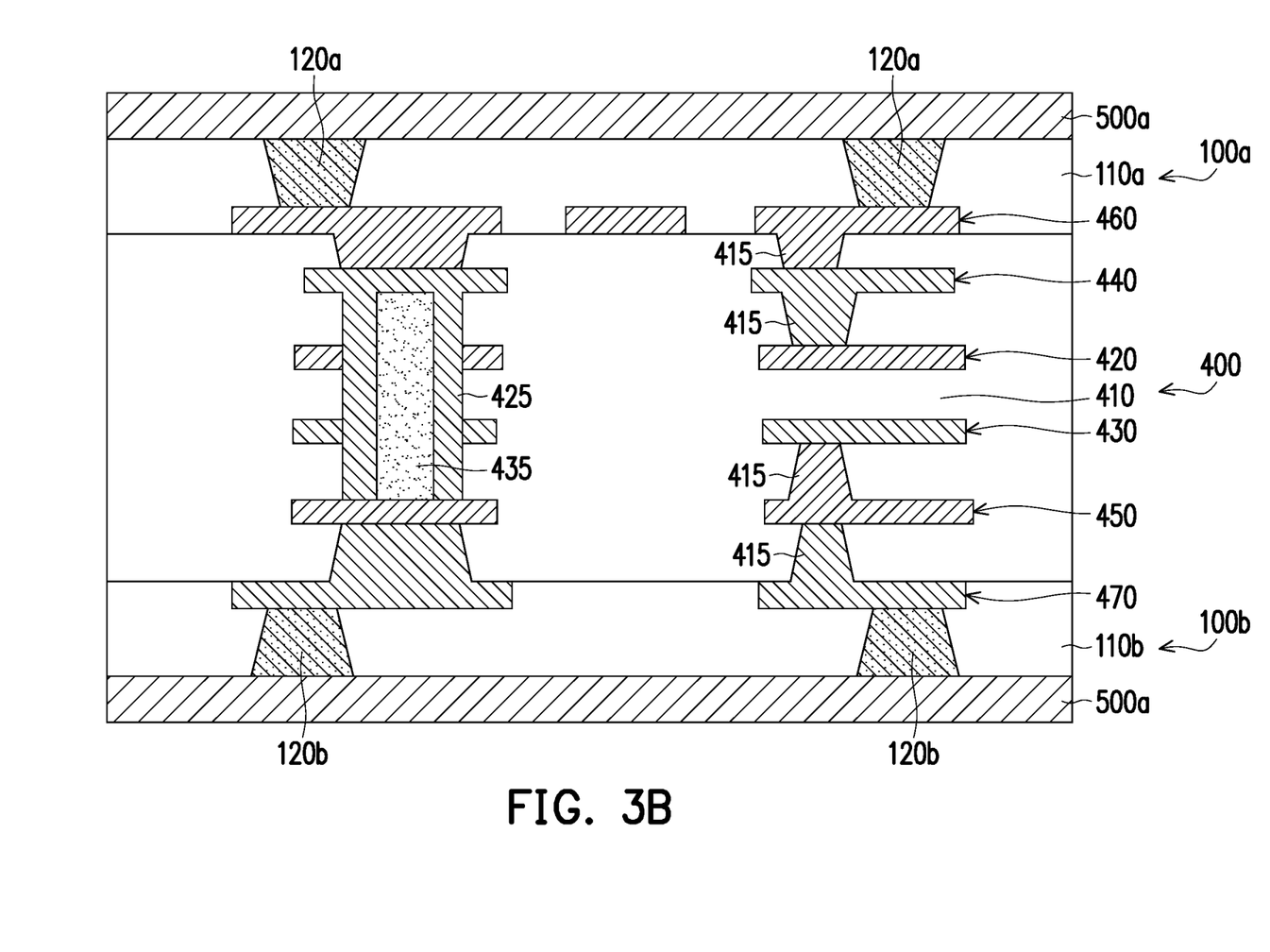
Figure 3C:
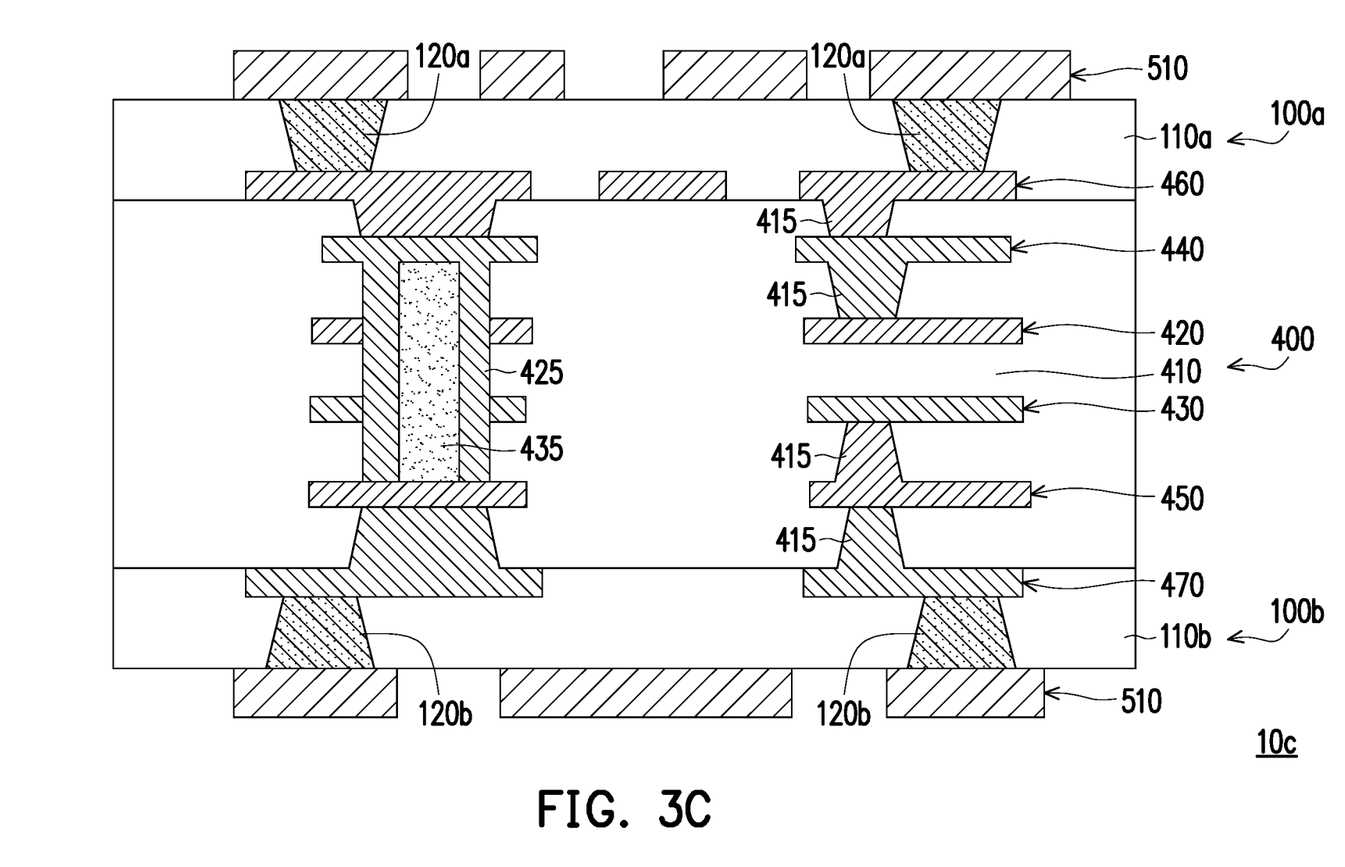

FIG. 3A to FIG. 3C are schematic cross-sectional views of a manufacturing method of a circuit board structure according to another embodiment of the invention. Referring to FIG. 3A and FIG. 1A at the same time, a circuit board structure 10c of the present embodiment is similar to the circuit board structure 10b. The difference between the two is that a first sub-circuit board 400 of the present embodiment is embodied as a multilayer circuit board. Specifically, in the present embodiment, the first sub-circuit board 400 further includes a plurality of circuit layer 420, 430, 440, 450, 460, 470 and a plurality of dielectric layers 410. The circuit layers 420, 430, 440, 450, 460, 470 and the dielectric layers 410 are alternately arranged, and first conductive through holes 415 penetrate the dielectric layers 410 and are electrically connected to the circuit layers 420 and 440, the circuit layers 440 and 460, the circuit layers 430 and 450, and the circuit layers 450 and 470. Moreover, the first conductive through holes 425 penetrate the plurality of dielectric layers 410 and the circuit layers 420, 430, and are electrically connected to the circuit layers 440, 420, 430, 450, wherein the first conductive through holes 425 are filled with an insulating resin 435.

Next, referring further to FIG. 3A at the same time, a second sub-circuit board 100a having a first substrate 110a and second conductive through holes 120a is provided on the circuit layer 460, and a third sub-circuit board 100b having a second substrate 110b and third conductive through holes 120b is provided on the circuit layer 470. The second conductive through holes 120a penetrate the first substrate 110a, and the third conductive through holes 120b penetrate the second substrate 110b. Moreover, a metal layer 500a is provided on the surface of the first substrate 110a relatively far away from the circuit layer 460 and on the surface of the second substrate 110b relatively far away from the circuit layer 470, respectively.

Then, referring to FIG. 3B, the metal layer 500a, the second sub-circuit board 100a, the first sub-circuit board 400, and the third sub-circuit board 100b are laminated so that the second conductive through holes 120a are abutted against the circuit layer 460 and electrically connected to the metal layer 500a and the circuit layer 460, so that the third conductive through holes 120b are abutted against the circuit layer 470 and electrically connected to the metal layer 500a and the circuit layer 470. At this point, since the first substrate 110a and the second substrate 110b are not completely cured and have flexibility and adhesiveness, the first substrate 110a and the second substrate 110b may be bonded to the first sub-circuit board 400 and squeezed onto the surface of the dielectric layer 410 exposed by the circuit layers 460 and 470. After lamination and curing, the first substrate 110a and the second substrate 110b may be transformed from the B-stage state to the C-stage state. That is, the second sub-circuit board 100a and the third sub-circuit board 100b are in a completely cured state, so that the first sub-circuit board 400, the second sub-circuit board 100a, and the third sub-circuit board 100b are firmly joined together. Lastly, referring to FIG. 3B and FIG. 3C at the same time, the metal layer 500a is patterned to form a patterned circuit layer 510 to complete the manufacture of the circuit board structure 10c.

In short, the second sub-circuit board 100a and the third sub-circuit board 100b of the present embodiment may be regarded as a type of interposer, and the states of the first substrate 110a and the second substrate 110b are changed by a hot pressing method so that the first substrate 110a and the second substrate 110b are directly bonded on the first sub-circuit board 400. Thereby, no solder and underfill are needed, and the manufacturing cost of the circuit board structure 10c may be effectively reduced. Moreover, since solder is not used, the bonding yield among the first sub-circuit board 400, the second sub-circuit board 100a, and the third sub-circuit board 100b may be effectively improved, thereby improving the structural reliability of the circuit board structure 10c of the present embodiment. In addition, via the material properties of the first substrate 110a and the second substrate 110b, the user may increase the number of the patterned circuit layer 510 according to requirements, thereby increasing the number of layers and applications of the circuit board structure 10c.

Figure 4:
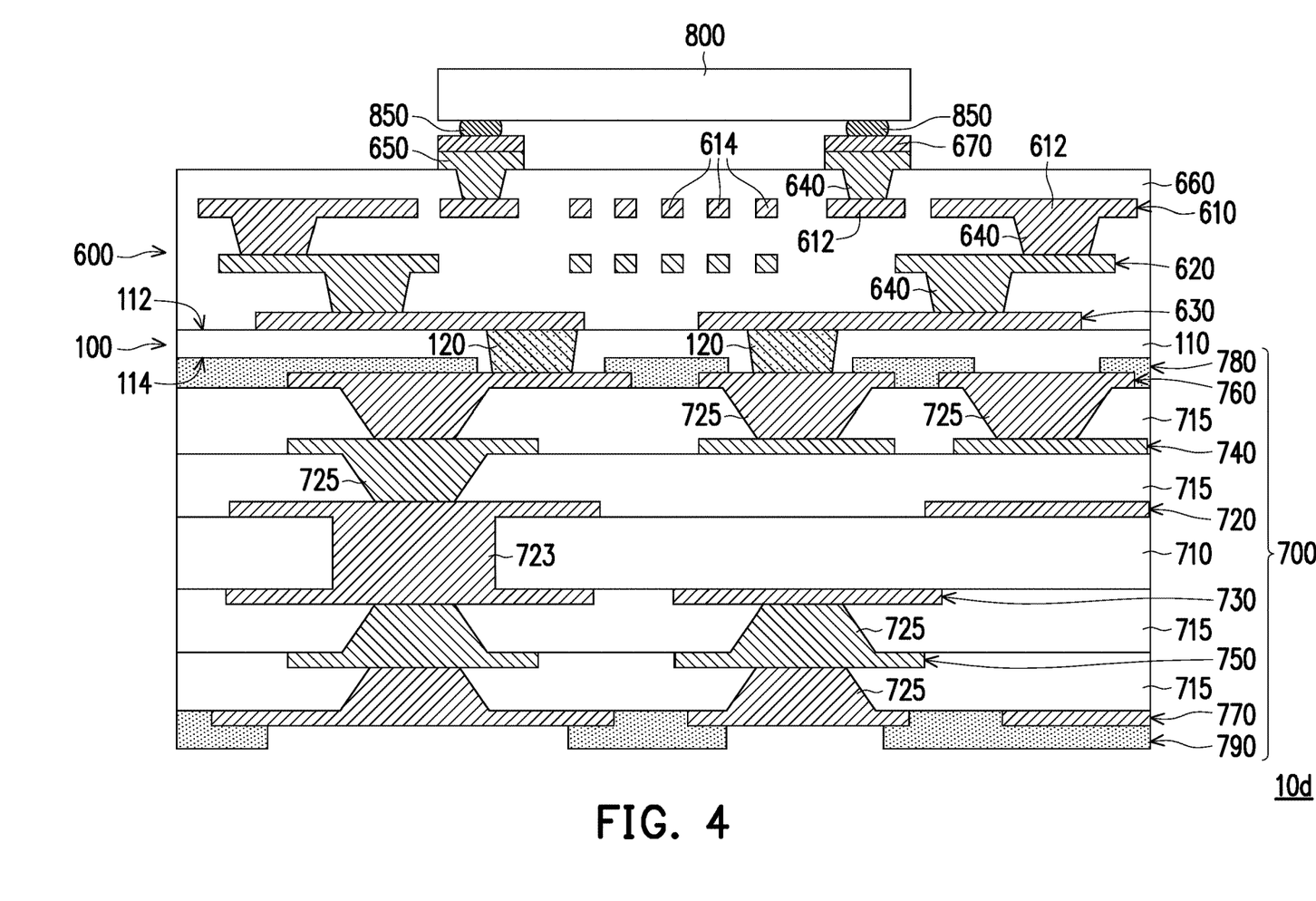
FIG. 4 is a schematic cross-sectional view of an electronic device disposed on another circuit board structure according to an embodiment of the invention.

FIG. 4 is a schematic cross-sectional view of an electronic device disposed on another circuit board structure according to an embodiment of the invention. Referring to FIG. 4 and FIG. 1B at the same time, a circuit board structure 10d of the present embodiment is similar to the circuit board structure 10a. The difference between the two is that a second sub-circuit board 600 of the present embodiment is embodied as a reconfiguration circuit board having a fine circuit. In detail, the second sub-circuit board 600 of the present embodiment includes circuit layers 610, 620, 630, second conductive through holes 640, pads 650, a dielectric layer 660, and surface protection layers 670. The circuit layers 610, 620, 630 and the dielectric layer 660 are alternately arranged, the pads 650 are located on the outermost dielectric layer 660, and the surface protection layers 670 are disposed on the pads 650. The second conductive through holes 640 are electrically connected to the circuit layers 610, 620, 630 and the pads 650. Here, the circuit layer 610 includes a general circuit 612 and a fine circuit 614. An electronic device 800 (for example, a chip) is electrically connected to the surface protection layers 670 on the pads 650 via bumps 850, i.e., flip-chip bonding. The material of the surface protection layers 670 is, for example, ENEPIG, an organic solderability preservative (OSP) layer, or electroless nickel immersion gold (ENIG), but is not limited thereto.

In addition, the structure of a third sub-circuit board 700 of the present embodiment is also different from the third sub-circuit board 300a in FIG. 1B. In detail, the third sub-circuit board 700 of the present embodiment is embodied as a multilayer circuit board. The third sub-circuit board 700 includes a plurality of circuit layers 720, 730, 740, 750, 760, 770, a plurality of dielectric layers 710, 715, a first solder mask 780, and a second solder mask 790. The circuit layers 720, 730, 740, 750, 760, 770 and the dielectric layers 710, 715 are alternately arranged. The first solder mask 780 covers the circuit layer 760 and exposes a portion of the circuit layer 760 as pads electrically connected to the first conductive through holes 120 of the first sub-circuit board 100. The second solder mask 790 covers the circuit layer 770 and exposes a portion of the circuit layer 770 as pads for electrical connection with an external circuit. A first conductive through hole 723 penetrates the dielectric layer 710 and is electrically connected to the circuit layers 720 and 730, and first conductive through holes 725 penetrate the dielectric layer 715 and are electrically connected to the circuit layers 720 and 740, the circuit layers 740 and 760, the circuit layers 730 and 750, and the circuit layers 750 and 770.

In short, the first sub-circuit board 100 of the present embodiment may be regarded as an interposer, and the state of the substrate 110 is changed by a hot pressing method so that the circuit layer 630 and the dielectric layer 660 of the second sub-circuit board 600 and the first solder mask 780 of the third sub-circuit board 700 are directly bonded on the upper surface 112 and the lower surface 114 of the substrate 110. Thereby, no solder and underfill are needed, and the manufacturing cost of the circuit board structure 10d may be effectively reduced. Moreover, since solder is not used, the bonding yield among the first sub-circuit board 100, the second sub-circuit board 600, and the third sub-circuit board 700 may be effectively improved, thereby improving the structural reliability of the circuit board structure 10d of the present embodiment.

Based on the above, in the circuit board structure and the manufacturing method thereof of the invention, the circuit board structure is formed by laminating the first sub-circuit board, the second sub-circuit board, and the third sub-circuit board. At least two of the first conductive through holes, the second conductive through holes, and the third conductive through holes are alternately arranged in the axial direction perpendicular to the extending direction of the first sub-circuit board, and the first sub-circuit board, the second sub-circuit board, and the third sub-circuit board are electrically connected to one another via the first conductive through holes, the second conductive through holes, and the third conductive through holes. Thereby, the manufacturing method of the circuit board structure of the invention does not need to use solder and underfill, thus effectively reducing the manufacturing cost of the circuit board structure. Moreover, since solder is not used, the bonding yield among the first sub-circuit board, the second sub-circuit board, and the third sub-circuit board may be effectively improved, thereby improving the structural reliability of the circuit board structure of the invention.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A circuit board structure, comprising:
   a first sub-circuit board having an upper surface and a lower surface opposite to each other, and comprising at least one first conductive through hole;
   a second sub-circuit board disposed on the upper surface of the first sub-circuit board, and the second sub-circuit board comprising:
      at least one second conductive through hole;
      a first substrate having a first surface and a second surface opposite to each other, wherein the at least one second conductive through hole penetrates the first substrate;
      a first circuit layer disposed on the first surface of the first substrate and exposing a portion of the first surface;
      a second circuit layer disposed on the second surface of the first substrate and exposing a portion of the second surface, wherein the first circuit layer and the second circuit layer are electrically connected via the at least one second conductive through hole, and the second circuit layer is electrically connected to the at least one first conductive through hole of the first sub-circuit board;
      a first solder mask disposed on the first surface exposed by the first circuit layer, and extended to cover a portion of the first circuit layer; and
      a second solder mask disposed on the second surface exposed by the second circuit layer, and extended to cover a portion of the second circuit layer, wherein the second solder mask is directly connected to the first sub-circuit board; and
   a third sub-circuit board disposed on the lower surface of the first sub-circuit board, and comprising at least one third conductive through hole, wherein at least two of the at least one first conductive through hole, the at least one second conductive through hole, and the at least one third conductive through hole are alternately arranged in an axial direction perpendicular to an extending direction of the first sub-circuit board, and the first sub-circuit board, the second sub-circuit board, and the third sub-circuit board are electrically connected to one another.

2. The circuit board structure of claim 1, wherein the first sub-circuit board further comprises a substrate having the upper surface and the lower surface, and the at least one first conductive through hole penetrates the substrate.

3. The circuit board structure of claim 1, wherein the third sub-circuit board further comprises:
   a second substrate having a third surface and a fourth surface opposite to each other, wherein the at least one third conductive through hole penetrates the second substrate;
   a third circuit layer disposed on the third surface of the second substrate and exposing a portion of the third surface; and
   a fourth circuit layer disposed on the fourth surface of the second substrate and exposing a portion of the fourth surface, wherein the third circuit layer and the fourth circuit layer are electrically connected via the at least one third conductive through hole, and the third circuit layer is electrically connected to the at least one first conductive through hole of the first sub-circuit board.

4. The circuit board structure of claim 3, wherein the third sub-circuit board further comprises:
   another first solder mask disposed on the third surface exposed by the third circuit layer, and extended to cover a portion of the third circuit layer; and
   another second solder mask disposed on the fourth surface exposed by the fourth circuit layer, and extended to cover a portion of the fourth circuit layer.

5. A circuit board structure, comprising:
   a first sub-circuit board having an upper surface and a lower surface opposite to each other, and comprising at least one first conductive through hole;
   a second sub-circuit board disposed on the upper surface of the first sub-circuit board, and the second sub-circuit board comprising:
      at least one second conductive through hole;
      a first substrate having a first surface and a second surface opposite to each other, wherein the at least one second conductive through hole penetrates the first substrate;
      a first circuit layer disposed on the first surface of the first substrate and exposing a portion of the first surface; and
      a second circuit layer disposed on the second surface of the first substrate and exposing a portion of the second surface, wherein the first circuit layer and the second circuit layer are electrically connected via the at least one second conductive through hole, and the second circuit layer is electrically connected to the at least one first conductive through hole of the first sub-circuit board; and a third sub-circuit board disposed on the lower surface of the first sub-circuit board, and the third sub-circuit board comprising:
  at least one third conductive through hole;
  a second substrate having a third surface and a fourth surface opposite to each other, wherein the at least one third conductive through hole penetrates the second substrate;
  a third circuit layer disposed on the third surface of the second substrate and exposing a portion of the third surface;
  a fourth circuit layer disposed on the fourth surface of the second substrate and exposing a portion of the fourth surface, wherein the third circuit layer and the fourth circuit layer are electrically connected via the at least one third conductive through hole, and the third circuit layer is electrically connected to the at least one first conductive through hole of the first sub-circuit board;
  a first solder mask disposed on the third surface exposed by the third circuit layer, and extended to cover a portion of the third circuit layer, wherein the first solder mask is directly connected to the first sub-circuit board; and
  a second solder mask disposed on the fourth surface exposed by the fourth circuit layer, and extended to cover a portion of the fourth circuit layer;
wherein at least two of the at least one first conductive through hole, the at least one second conductive through hole, and the at least one third conductive through hole are alternately arranged in an axial direction perpendicular to an extending direction of the first sub-circuit board, and the first sub-circuit board, the second sub-circuit board, and the third sub-circuit board are electrically connected to one another.

* * * * *